United States Patent
Mehrpoo et al.

(10) Patent No.: US 12,289,086 B2
(45) Date of Patent: Apr. 29, 2025

(54) CONFIGURABLE ATTENUATOR CIRCUIT AND METHOD

(71) Applicant: AVAGO TECHNOLOGIES INTERNATIONAL SALES PTE. LIMITED, Singapore (SG)

(72) Inventors: Mohammadreza Mehrpoo, Eindhoven (NL); Frank Van der Goes, Zeist (NL); Jan Mulder, Houten (NL); Alireza Nilchi, Irvine, CA (US); Sijia Wang, Utrecht (NL)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 200 days.

(21) Appl. No.: 17/892,003

(22) Filed: Aug. 19, 2022

(65) Prior Publication Data
US 2024/0063776 A1 Feb. 22, 2024

(51) Int. Cl.
*H03H 11/24* (2006.01)
(52) U.S. Cl.
CPC .................. *H03H 11/24* (2013.01)
(58) Field of Classification Search
CPC ............... H03H 11/24; H03H 11/245
USPC .......................................... 327/308
See application file for complete search history.

(56) References Cited

U.S. PATENT DOCUMENTS

| | | | |
|---|---|---|---|
| 5,548,838 A * | 8/1996 | Talwar | H04B 1/126 455/278.1 |
| 6,229,375 B1 * | 5/2001 | Koen | H03G 7/001 327/350 |
| 6,489,856 B1 | 12/2002 | Weigand | |
| 7,026,989 B1 * | 4/2006 | Minkoff | H01Q 3/36 342/372 |
| 7,660,571 B2 | 2/2010 | Chang et al. | |
| 8,633,754 B2 | 1/2014 | Granger-Jones et al. | |
| 9,100,046 B2 | 8/2015 | Granger-Jones | |
| 9,397,635 B2 | 7/2016 | Costa | |
| 2007/0105517 A1 * | 5/2007 | Chang | H03G 1/0088 455/12.1 |
| 2011/0140812 A1 * | 6/2011 | Wu | H03H 7/25 333/81 R |
| 2017/0207769 A1 | 7/2017 | Shrivastava | |
| 2022/0131531 A1 * | 4/2022 | Jeon | H03H 11/245 |

OTHER PUBLICATIONS

I. Song, M. Cho and J. D. Cressler, "Design and Analysis of a Low Loss, Wideband Digital Step Attenuator With Minimized Amplitude and Phase Variations," in IEEE Journal of Solid-State Circuits, vol. 53, No. 8, pp.

(Continued)

*Primary Examiner* — William Hernandez
(74) *Attorney, Agent, or Firm* — Foley & Lardner LLP

(57) ABSTRACT

Described herein are related to a device for communication. In one aspect, the device a first circuit configured to generate a signal. In one aspect, the device includes a port. In one aspect, the device includes a set of switches. Each switch of the set of switches may be coupled in parallel between the first circuit and the port. In one aspect, the device includes a second circuit configured to enable a subset of the set of switches, according to an amplitude of the signal.

20 Claims, 8 Drawing Sheets

(56) References Cited

OTHER PUBLICATIONS

S. Chen, A. Zhang and J. Xu, "A Digitally Controllable Attenuator with an Accuracy of 0.2dB over 1-30GHz Based on a 16-bit Digital-to-Analog Converter," 2021 International Conference on Microwave and Millimeter Wave Technology (ICMMT), 2021, pp. 1-3.

* cited by examiner

CONFIGURABLE ATTENUATOR CIRCUIT AND METHOD

FIELD OF THE DISCLOSURE

This disclosure generally relates to circuits for and methods of adaptively attenuating a signal.

BACKGROUND

An electronic device often amplifies a signal for communication. For example, the electronic device includes a first circuit configured to perform complex computations, and a second circuit configured to transmit data through a communication medium (e.g., air or cable). The first circuit may operate based on a first supply voltage to generate a first signal including or representing data for communication. The second circuit may operate based on a second supply voltage higher than the first supply voltage to amplify the first signal to obtain a second signal, and may transmit the second signal through the communication medium. Amplifying the first signal may be subject to various trade-offs. For example, a large gain of amplifying the first signal having a first value below a threshold value may allow the second signal to accurately represent data for transmission. However, such large gain of amplifying the first signal having a second value above the threshold value may clip or saturate the second signal, such that the second signal may not accurately represent the data for transmission.

SUMMARY

Various embodiments disclosed herein are related to a device for communication. In some embodiments, the device includes a first circuit configured to provide a signal. In some embodiments, the device includes a port. In some embodiments, the device includes a first set of transistors including a first number of transistors coupled in parallel between the first circuit and the port. In some embodiments, the device includes a second set of transistors including a second number of transistors coupled in parallel between the first circuit and the port. The second number may be larger than the first number.

In some embodiments, the first set of transistors coupled in parallel has a first resistance, in response to the first set of transistors being enabled. In some embodiments, the second set of transistors coupled in parallel has a second resistance, in response to the second set of transistors being enabled. In some embodiments, the second resistance is lower than the first resistance.

In some embodiments, the device includes a second circuit configured to i) determine an amplitude of the signal, ii) determine, from the first set of transistors, the second set of transistors, or a combined set of the first set of transistors and the second set of transistors, a third set of transistors to enable, according to the determined amplitude of the signal, and iii) enable the third set of transistors. In some embodiments, the second circuit is configured to determine the first set of transistors as the third set of transistors, in response to the determined amplitude of the signal being larger than a first threshold. In some embodiments, the second circuit is configured to determine the second set of transistors as the third set of transistors, in response to the determined amplitude of the signal being between the first threshold and a second threshold lower than the first threshold. In some embodiments, the second circuit is configured to determine the combined set of the first set of transistors and the second set of transistors as the third set of transistors, in response to the determined amplitude of the signal being below the second threshold.

In some embodiments, the device includes a third circuit configured to generate a voltage to apply to gate electrodes of the third set of transistors.

In some embodiments, the first circuit is a digital-to-analog converter.

In some embodiments, the device includes a resistor including a first electrode coupled to the first circuit and a second electrode coupled to a metal rail. A resistance of the resistor may be adjustable.

In some embodiments, the device includes a third set of transistors including a third number of transistors coupled in parallel between the first circuit and the port. The third number may be larger than the second number.

Various embodiments disclosed herein are related to a device for communication. In some embodiments, the device includes a first circuit configured to generate a signal. In some embodiments, the device includes a second circuit configured to attenuate the signal. In some embodiments, the device includes a third circuit configured to i) cause the second circuit to apply an amount of attenuation to the signal, according to an amplitude of the signal, and ii) adjust a phase of the signal, according to the amount of attenuation.

In some embodiments, the second circuit includes a set of switches coupled in parallel between the first circuit and a port. In some embodiments, the third circuit is configured to enable a subset of the set of switches, according to the amplitude of the signal.

In some embodiments, a first subset of the set of switches has a first resistance, in response to the first subset of the set of switches being enabled. In some embodiments, a second subset of the set of switches has a second resistance, in response to the second subset of the set of switches being enabled. In some embodiments, the second resistance is lower than the first resistance. In some embodiments, the second subset of the set of switches has a larger number of switches than the first subset of the set of switches. In some embodiments, the third circuit is configured to enable the first subset of the set of switches, in response to the determined amplitude of the signal being larger than a first threshold. In some embodiments, the third circuit is configured to enable the second subset of the set of switches, in response to the determined amplitude of the signal being between the first threshold and a second threshold lower than the first threshold. In some embodiments, the third circuit is configured to enable the set of switches, in response to the determined amplitude of the signal being below the second threshold.

In some embodiments, the second circuit includes a first resistor and a first switch coupled in series with each other to the first circuit, and a second resistor and a second switch coupled in series with each other to the first circuit. In some embodiments, the third circuit is configured to enable the first switch, the second switch, or a combination of the first switch and the second switch, according to the amount of attenuation.

In some embodiments, the first circuit is a digital-to-analog converter.

Various embodiments disclosed herein are related to a device for communication. In some embodiments, the device includes a first circuit configured to generate a signal. In some embodiments, the device includes a port. In some embodiments, the device includes a set of transistors. Each transistor of the set of transistors may include a first electrode coupled to the first circuit, and a second electrode coupled to the port. In some embodiments, the device includes a second circuit configured to determine an amplitude of the signal, and enable a subset of the set of transistors to enable, according to the determined amplitude of the signal.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

Figure 1:
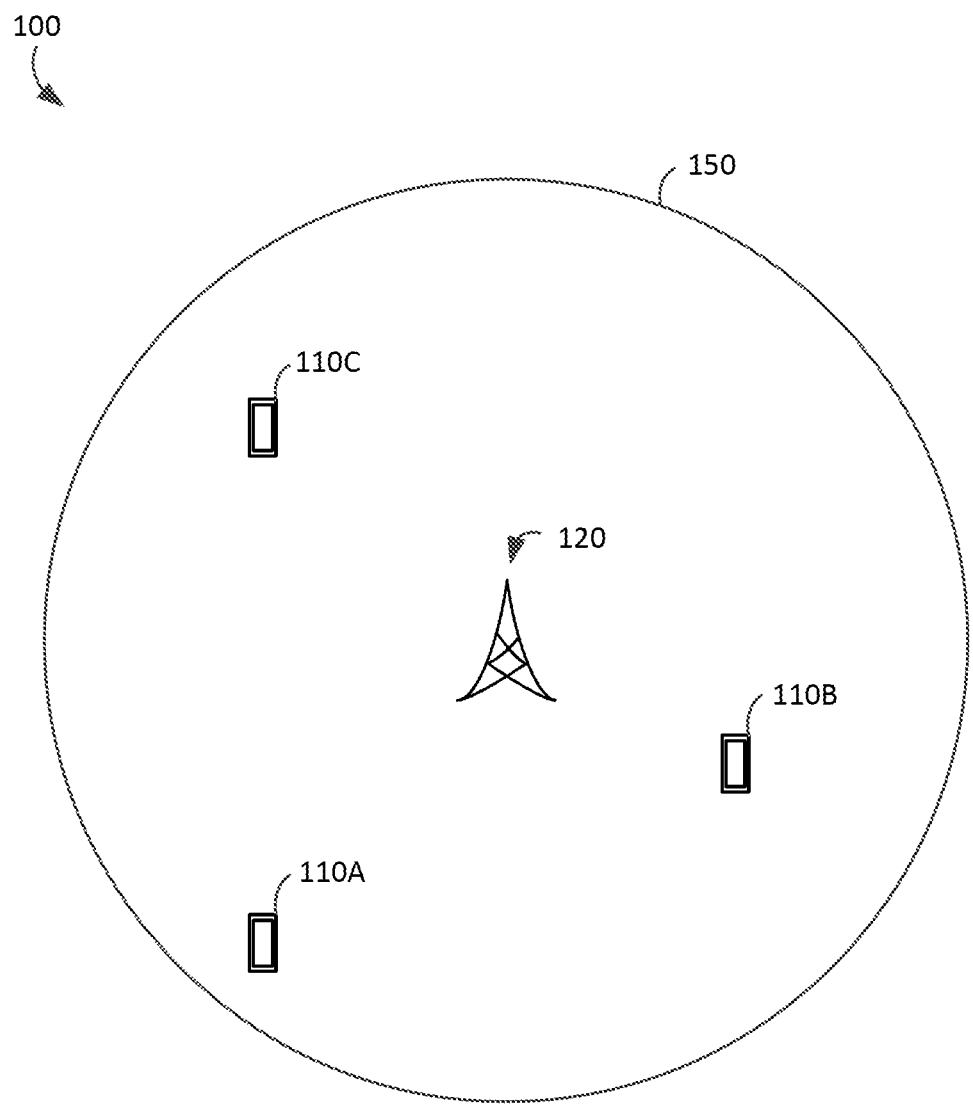
FIG. 1 is a block diagram of a communication system including a base station and client devices, in accordance with some embodiments.

The details of various embodiments of the methods and systems are set forth in the accompanying drawings and the description below.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed herein are related to circuits for and methods of adaptively attenuating a signal for communication. In one aspect, a device for communication includes a first circuit configured to generate a signal, a port, and a set of switches coupled in parallel between the first circuit and the port. A port may be a pad, a metal rail, or any conductive component that can receive or provide an electrical signal (e.g., a voltage or a current). An input port may be a port to receive a signal, where an output port may be a port to provide or output a signal. In one aspect, the device includes a second circuit configured to enable a subset of the set of switches, according to an amplitude of the signal.

In one aspect, each switch can be embodied as a transistor. A transistor may be an N-type transistor or a P-type transistor. An N-type transistor may be a transistor that utilizes electrons as majority carriers. A P-type transistor may be a transistor that utilizes holes as majority carriers. A transistor can be any suitable transistor including, but not limited to, metal oxide semiconductor field effect transistor (MOSFET), bipolar junction transistor (BJT), high voltage transistor, high frequency transistor, FinFET, GaaFET, planar MOS transistor with raised source/drains, nanosheet FET, nanowire FET, or the like. One or more transistors shown or described herein can be embodied as two or more transistors connected in parallel.

In one aspect, a transistor includes a source electrode, a drain electrode and a gate electrode. A source electrode and a drain electrode can be interchangeable, according to voltages applied to the source electrode and the drain electrode. Hence, a source electrode or a drain electrode can be referred to as a source/drain electrode herein. According to a voltage applied to a gate electrode of the transistor, current may flow between a source electrode and a drain electrode. In certain application, a transistor can operate as a switch. For example, if a voltage difference between a gate electrode and a source electrode of a transistor is larger than a threshold voltage of the transistor, the transistor can be enabled to electrically couple between the source electrode and the drain electrode of the transistor. For example, if a voltage difference between a gate electrode and a source electrode of a transistor is less than a threshold voltage of the transistor, the transistor can be disabled to electrically decouple between the source electrode and the drain electrode of the transistor.

Advantageously, attenuation can be adaptively applied to a signal for communication by configuring or enabling a subset of the set of switches, according to an amplitude of the signal. In one example, if a switch is enabled, the enabled switch can provide a low resistance (e.g., 5~100 ohm). If a switch is disabled, the disabled switch can provide a high resistance (e.g., over 100 Mega ohm). If a subset of the set of switches is enabled, a resistance corresponding to a parallel resistance of the subset of the set of switches can be applied to the signal. The parallel resistance of the enabled subset of the set of switches may correspond to an amount of attenuation applied to the signal. Hence, by enabling a subset of the set of switches according to an amplitude of a signal, a corresponding amount of attenuation can be selectively applied to the signal. By adaptively providing different amounts of attenuation for different amplitudes of the signal, a linearity of the device can be improved. For example, for a signal having a first amplitude above a threshold value, a first subset of the set of switches (or transistors) can be enabled to provide a first amount of attenuation to avoid saturation or clipping. For the signal having a second amplitude below the threshold value, a second subset of the set of switches (or transistors) having a larger number of switches (or transistors) than the first subset can be enabled to provide a second amount of attenuation lower than the first amount of attenuation.

In one aspect, a device or a transmitter disclosed herein is implemented for a radio frequency (RF) communication, such as a cellular communication (3G, 4G, 5G, 6G, etc.), Wi-Fi communication, Bluetooth communication etc. In some embodiments, the transmitter is a transmitter of a base station (e.g., eNode B (eNB), gNodeB (gNB), etc.) that provides a wireless communication. In one aspect, the transmitter includes or is implemented as a digital-to-analog converter (DAC) operating at a high speed (e.g., over 5 Giga samples per second). The DAC may convert a modulated signal at RF in a digital representation into an analog signal in an analog representation. The DAC may provide the analog signal to a preamplifier or a power amplifier for transmission through an antenna, such that an analog upconverter or an analog mixer can be omitted. By omitting the analog upconverter or the analog mixer, the transmitter can reduce power consumption, improve linearity, provide design flexibility, and can be implemented in a small form factor. Moreover, modulation or upconversion of a signal in a baseband frequency (e.g., 100 MHz~1 GHz) to a RF frequency (e.g., 1~10 GHz) can be performed by a digital logic circuit that may be less susceptible to noise than an analog circuit, such that the transmitter can improve a signal quality. In some embodiments, the DAC is provided in an integrated circuit package (e.g., multichip module or single chip package). Although the DAC disclosed herein is provided for a transmitter for a wireless communication, the DAC can be implemented for different applications. For example, the DAC disclosed herein can be implemented for a wired communication, an optical communication, or any computing device that performs a high speed digital-to-analog conversion.

In some embodiments, the device adjusts an amplitude and/or a phase of a signal to transmit, according to an amount of attenuation applied to the signal. In one aspect, attenuation applied to a signal may introduce errors to the signal or cause the signal to be non-linear in terms of amplitude and phase. The device disclosed herein may set or adjust the amplitude of the signal to correct for or compensate for the amplitude error or amplitude non-linearity. Similarly, the device disclosed herein may determine a phase offset to compensate for the change in the phase of the signal due to the attenuation, and set or adjust the phase of the signal according to the phase offset. Accordingly, an amplitude error and/or a phase error due to attenuation applied can be reduced or removed.

FIG. 1 is a block diagram of a communication system 100 including a base station 120 and client devices 110A, 110B, 110C, in accordance with some embodiments. The base station 120 and the client devices 110A, 110B, 110C may communicate through a wireless communication link. A wireless communication link may be a cellular communication link conforming to 3G, 4G, 5G, 6G, or other cellular communication protocols. In one aspect, the client devices 110A . . . 110C are located within a geographical boundary 150 with respect to the base station 120, and may communicate with or through the base station 120. In some embodiments, the communication system 100 includes more, fewer, or different number of base stations 120 and/or client devices 110 than shown in FIG. 1.

In some embodiments, the client device 110 may be a user device such as a mobile phone, a smart phone, a personal digital assistant (PDA), tablet, laptop computer, wearable computing device (e.g., head mounted display, smart watch), etc. A client device 110 may be also referred to as user equipment (UE). Each client device 110 may communicate with the base station 120 through a corresponding communication link. For example, the client device 110 may transmit or provide a wireless signal at RF to a base station 120 through a wireless communication link (e.g., 3G, 4G, 5G, 6G or other cellular communication link), and/or receive a wireless signal at RF from the base station 120 through the wireless communication link (e.g., 3G, 4G, 5G, 6G or other cellular communication link). A wireless signal may be a signal exchanged or provided through a wireless medium (e.g., air). The wireless signal may include or carry data such as audio data, image data, text, etc.

In some embodiments, the base station 120 may be a device configured to provide a wireless communication to client devices 110 within a geographical boundary 150. Examples of the base station 120 include eNB, gNB, etc. The base station 120 may be communicatively coupled to another base station 120 or other communication devices through a wireless communication link and/or a wired communication link. The base station 120 may receive a wireless signal at RF from a client device 110 or another base station 120 through a wireless communication link. Additionally or alternatively, the base station 120 may transmit or provide a wireless signal at RF to another client device 110, another base station 120, or another communication device through a wireless communication link. Hence, the base station 120 allows communication among client devices 110 associated with the base station 120, or other client devices 110 associated with different base stations 120.

Figure 2:
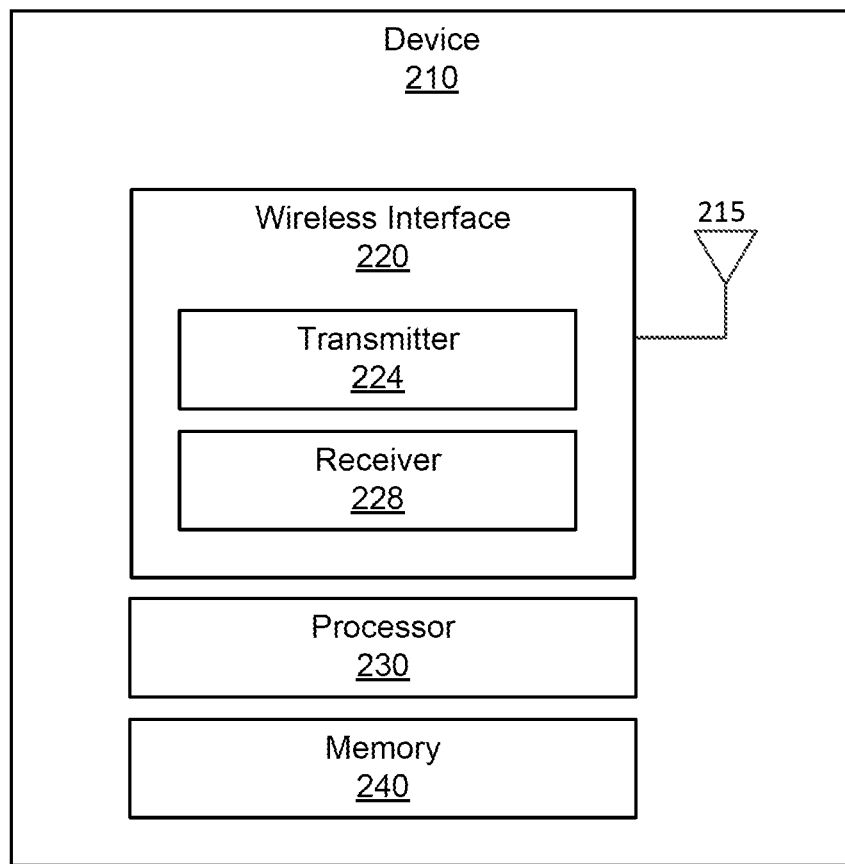
FIG. 2 is a block diagram of a device for communication through a wireless communication link, in accordance with some embodiments.

FIG. 2 is a block diagram of a device 210 for communication through a wireless communication link, in accordance with some embodiments. In some embodiments, the device 210 may be the base station 120, the client device 110, or any device that can communicate through a wireless communication link. In some embodiments, the device 210 includes an antenna 215, a wireless interface 220, a processor 230, and a memory device 240. These components may be embodied as hardware, software, firmware, or a combination thereof. In some embodiments, the device 210 includes more, fewer, or different components than shown in FIG. 2. For example, the device 210 may include an electronic display and/or an input device. For example, the device 210 may include additional antennas 215 and additional wireless interfaces 220 than shown in FIG. 2.

In some embodiments, the antenna 215 is a component that may receive a wireless signal at RF and/or transmit a wireless signal at RF through a wireless medium (e.g., air). The antenna 215 may be a dipole antenna, a patch antenna, a ring antenna, or any suitable antenna for wireless communication. In one aspect, a single antenna 215 is utilized for both transmitting a wireless signal and receiving a wireless signal. For receiving a wireless signal, the antenna 215 may detect a wireless signal having a change in an electromagnetic wave in a wireless medium (e.g., air), and provide, to the wireless interface 220, an electrical signal at RF having a voltage and/or a current corresponding to the detected change in the electromagnetic wave. An electrical signal at RF may be referred to as a RF signal herein. For transmitting a wireless signal, the antenna 215 may receive, from the wireless interface 220, an electrical signal at RF having a voltage and/or a current, and transmit, through the wireless medium (e.g., air), a wireless signal having a change in an electromagnetic wave corresponding to the electrical signal. In some embodiments, different antennas 215 can be utilized for transmitting the wireless signal and receiving the wireless signal. In some embodiments, multiple antennas 215 can be utilized to support multiple-in, multiple-out (MIMO) communication.

In some embodiments, the wireless interface 220 is a circuit or a component that may provide a RF signal to the antenna 215 or receive a RF signal from the antenna 215. In some embodiments, the wireless interface 220 includes a transmitter 224 and a receiver 228. In some embodiments, the transmitter 224 and the receiver 228 may be implemented in a same integrated circuit. In some embodiments, the transmitter 224 and the receiver 228 may be implemented in different integrated circuits. A transmitter 224 may be a circuit or a component that generates or provides a RF signal for transmitting data. In one aspect, the transmitter 224 may receive a baseband signal including or representing data (e.g., audio data, image data, text, or any data) for transmission at a baseband frequency (e.g., 0~1 GHz) from the processor 230, and upconvert the baseband signal to generate a RF signal. The transmitter 224 may provide the RF signal to an antenna 215 for transmission. A receiver 228 may be a circuit or a component that receives a RF signal for receiving data. In one aspect, the receiver 228 may receive a RF signal at the RF from an antenna 215, and downconvert the RF signal to a baseband frequency (e.g., 0~1 GHz) to obtain a downconverted signal at the baseband frequency. The downconverted signal at the baseband frequency may include or represent data (e.g., audio data, image data, text, or any data) generated by another device (e.g., another base station 120, another client device 110, etc.). The receiver 228 may provide the downconverted signal to the processor 230. In one configuration, the transmitter 224 and the receiver 228 may be coupled to the same antenna 215. In one configuration, the transmitter 224 and the receiver 228 may be coupled to different antennas 215.

The processor 230 is a component that processes data. The processor 230 may be embodied as FPGA, ASIC, a logic circuit, etc. The processor 230 may obtain instructions from the memory device 240, and execute the instructions. In one aspect, the processor 230 may receive the downconverted signal at the baseband frequency from the wireless interface 220, and decode or process data included in or represented by the downconverted signal. For example, the processor 230 may obtain audio data or image data from the downconverted signal. In one aspect, the processor 230 may generate or obtain data for transmission at the baseband frequency, and encode or process the data. For example, the processor 230 may encode or process image data or audio data at the baseband frequency, and provide a baseband signal including or representing the encoded or processed data to the wireless interface 220 for transmission.

The memory device 240 is a component that stores data. The memory device 240 may be embodied as RAM, flash memory, ROM, EPROM, EEPROM, registers, a hard disk, a removable disk, a CD-ROM, or any device capable for storing data. The memory device 240 may be embodied as a non-transitory computer readable medium storing instructions executable by the processor 230 to perform various functions of the device 210 disclosed herein. In some embodiments, the memory device 240 and the processor 230 are integrated as a single component (or an integrated circuit). In some embodiments, the memory device 240, the processor 230, and the wireless interface 220 are integrated as a single component (or an integrated circuit). In some embodiments, the memory device 240, the processor 230, and the wireless interface 220 are implemented as discrete components (or separate integrated circuits).

Figure 3:
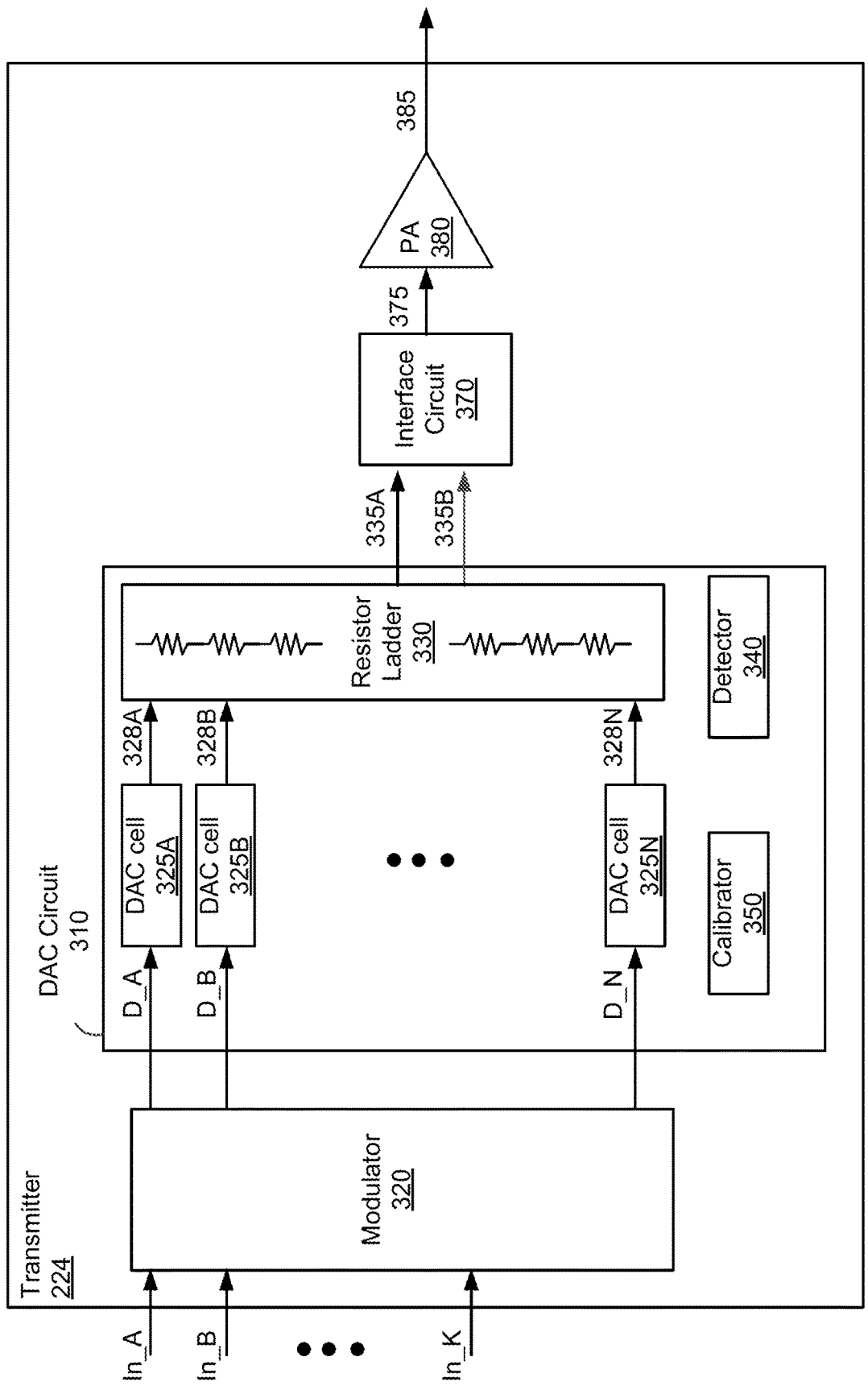
FIG. 3 is a schematic block diagram of a transmitter, in accordance with some embodiments.

FIG. 3 is a schematic diagram of a transmitter 224, in accordance with some embodiments. In some embodiments, the transmitter 224 includes a DAC 310 (also referred to as "a DAC circuit 310"), a modulator 320, an interface circuit 370, and a power amplifier (PA) 380. These components may operate together to generate a RF signal 385 for transmission. In one aspect, the modulator 320 operates in a digital domain, where the interface circuit 370 and the PA 380 operate in an analog domain. The DAC circuit 310 may operate in both the analog domain and the digital domain, and may operate as an interface between the modulator 320 operating in the digital domain and the interface circuit 370 and the PA 380 operating in the analog domain. In some embodiments, the transmitter 224 includes more, fewer, or different components than shown in FIG. 3. For example, the modulator 320 may be implemented as part of the processor 230.

In some embodiments, the modulator 320 is a circuit or a component that may receive a baseband signal including K-bit data $In\_A \ldots In\_K$ in a digital representation, and perform modulation or upconversion on the K-bit data $In\_A \ldots In\_K$. A modulation or an upconversion may be multiplying a value represented by the K-bit data $In\_A \ldots In\_K$ by a sine function or a cosine function of a carrier frequency at RF. A carrier frequency may be a frequency (e.g., 2~60 GHz), at which a wireless signal can be transmitted. In one approach, the modulator 320 can perform multiplication of the value represented by the K-bit data $In\_A \ldots In\_K$ and the sine function or the cosine function of the carrier frequency by a digital logic circuit to obtain N-bit data $D\_A \ldots D\_N$ representing an upconverted signal at RF. The modulator 320 may provide the N-bit data $D\_A \ldots D\_N$ in a digital representation to the DAC circuit 310.

In some embodiments, the DAC circuit 310 is a circuit or a component that may perform a digital-to-analog conversion. In some embodiments, the DAC circuit 310 includes a plurality of DAC cells 325A . . . 325N, a resistor ladder 330, a detector 340, and a calibrator 350. These components may operate together to receive N-bit data $D\_A \ldots D\_N$ in a digital representation, and provide signals 335A, 335B in an analog representation corresponding to the N-bit data $D\_A \ldots D\_N$. For example, voltage amplitudes of the signals 335A, 335B may represent or correspond to a value of the N-bit data $D\_A \ldots D\_N$. In some embodiments, the DAC circuit 310 includes more, fewer, or different components than shown in FIG. 3.

In some embodiments, a DAC cell 325 is a circuit or a component that may receive one bit data D, and generate a current 328 corresponding to the one bit data D. In one configuration, the DAC cell 325 includes an input port coupled to the modulator 320, and an output port coupled to a corresponding resistor of the resistor ladder 330. A port may be a pad, a metal rail, or any conductive component that can receive or provide an electrical signal (e.g., a voltage or a current). An input port may be a port to receive a signal, where an output port may be a port to provide or output a signal. In this configuration, a DAC cell 325 may receive a one bit data D, and provide a current 328 having an amplitude corresponding to the one bit data D. For example, in response to the one bit data D having a value '0', the DAC cell 325 may bypass providing a current. For example, in response to the one bit data D having a value '1', the DAC cell 325 may provide a current 328 having a certain amplitude to the resistor ladder 330.

In some embodiments, the resistor ladder 330 is a circuit or a component that can provide voltage signals 335A, 335B corresponding to currents 328A . . . 328N from a set of DAC cells 325A . . . 325N. In one configuration, the resistor ladder 330 includes various resistors connected in a R-2R configuration. In one configuration, output ports of different DAC cells 325A can be coupled to corresponding resistors of the resistor ladder 330. In one configuration, the resistor ladder 330 includes output ports coupled to input ports of the interface circuit 370. In this configuration, the resistor ladder 330 can combine currents 328A . . . 328N from the set of DAC cells 325, and generate or provide voltage signals 335A, 335B corresponding to the combined current. The voltage signals 335A, 335B may be differential signals having opposite phases with each other. In one aspect, an amplitude of the combined current corresponds to amplitudes of the voltage signals 335A, 335B. For example, for '0001' of 4-bit input data corresponding to a value '1', a difference in amplitudes of the voltage signals 335A, 335B may be 100 mV corresponding to a current from a single DAC cell 325. For example, for '0111' of 4-bit input data corresponding to a value '3', a difference in amplitudes of the voltage signals 335A, 335B may be 300 mV corresponding to currents from three DAC cells 325. The resistor ladder 330 may provide the voltage signals 335A, 335B at its output ports.

In some embodiments, the detector 340 is a circuit or a component that may detect an error in one or more DAC cells 325. The detector 340 can be implemented as an analog circuit, a digital logic circuit, or a combination of the analog circuit and the digital logic circuit. In one configuration, the detector 340 includes one or more input ports coupled to the resistor ladder 330, and an output port coupled to an input port of the calibrator 350. In this configuration, the detector 340 can detect characteristics of one or more DAC cells 325. Examples of characteristics of a DAC cell 325 include a timing of providing a current 328, an amplitude of the current 328, etc. The detector 340 may generate one or more feedback signals indicating the detected characteristics of a DAC cell 325, and provide the one or more feedback signals to the calibrator 350.

In some embodiments, the calibrator 350 is a circuit or a component that can perform calibration of DAC cells 325. In one aspect, each DAC cell 325 may have errors due to a process corner variation, a voltage variation, a temperature variation, or a combination of them. Examples of errors may include a timing error and an amplitude error. For example, timing errors or differences in timing of providing currents 328A . . . 328N by different DAC cells 325 can cause errors in combining currents 328A . . . 328N from different DAC cells 325, and may cause inaccuracy in generating the voltage signals 335A, 335B corresponding to N-bit data. For example, if a particular DAC cell 325 provides a current 328 later than other DAC cells 325 or does not provide a current 328 at a time period allocated for providing the current 328, then the current 328 from the DAC cell 325 may not be combined properly, and may cause the amplitudes of the voltage signals 335A, 335B to represent a wrong value of a N-bit data. For example, amplitude errors or differences in amplitudes of currents 328A . . . 328N provided by different DAC cells 325A . . . 325N can cause errors in an amplitude of the combined current from different DAC cells 325A . . . 325N, and may cause inaccuracy in amplitudes of the voltage signals 335A, 335B generated based on the combined current. For example, if a particular DAC cell 325 provides a current 328 having an amplitude less than or larger than amplitudes of currents 328 from other DAC cells 325, then the amplitudes of the voltage signals 335A, 335B generated based on the combined current may represent a wrong value of a N-bit data. In one aspect, the calibrator 350 can configure or adjust each DAC cell 325 to reduce timing errors and amplitude errors.

In one aspect, the calibrator 350 may receive one or more feedback signals indicative of characteristics of one or more DAC cells 325 from the detector 340, and adjust a configuration or setting of each DAC cell 325 according to the one or more feedback signals. Examples of configuration or setting of a DAC cell 325 include a configuration to adjust a drive strength of generating or providing the current 328 and/or a configuration to adjust an amplitude of the current 328. The calibrator 350 may determine a target configuration or a target setting of each DAC cell 325, and provide a configuration signal indicating the determined configuration or setting to each DAC cell 325. For example, if the calibrator 350 determines, based on one or more feedback signals, that a particular DAC cell 325 is slower than other DAC cells 325, the calibrator 350 may generate a configuration signal causing the DAC cell 325 to increase a drive strength to provide the current 328 faster. For example, if the calibrator 350 determines, based on one or more feedback signals, that a particular DAC cell 325 provides a current 328 with an amplitude larger than amplitudes of currents 328 provided by other DAC cells 325, the calibrator 350 may generate a configuration signal causing the DAC cell 325 to provide the current 328 with a lower amplitude.

In some embodiments, the interface circuit 370 is a circuit or a component that may interface between the DAC circuit 310 and the PA 380. Examples of the interface circuit 370 include a balun, an impedance matching circuit, etc. In one configuration, the interface circuit 370 includes a first input port coupled to a first output port of the resistor ladder 330, a second input port coupled to a second output port of the resistor ladder 330, and an output port coupled to an input port of the PA 380. In this configuration, the interface circuit 370 may convert differential signals 335A, 335B into a signal 375. For example, the interface circuit 370 may obtain a difference in amplitudes of the signals 335A, 335B, and provide the difference as the signal 375. In one aspect, the interface circuit 370 may provide impedance matching between the DAC circuit 310 and the PA 380, such that the input port of the PA 380 may have a certain impedance within a range (e.g., 40~60 ohm) to ensure that the PA 380 can operate properly.

In some embodiments, the PA 380 is a circuit or a component that can amplify the signal 375 to obtain the RF signal 385 for driving the antenna 215. In some embodiments, the PA 380 includes a single amplifier circuit or two or more amplifier circuits connected in cascade. In one configuration, the PA 380 includes an input port coupled to an output port of the interface circuit 370, and an output port coupled to the antenna 215. In this configuration, the PA 380 can amplify an amplitude of the signal 375 to obtain the RF signal 385 having an amplified amplitude, and provide the RF signal 385 to the antenna 215 for transmission.

Figure 4:
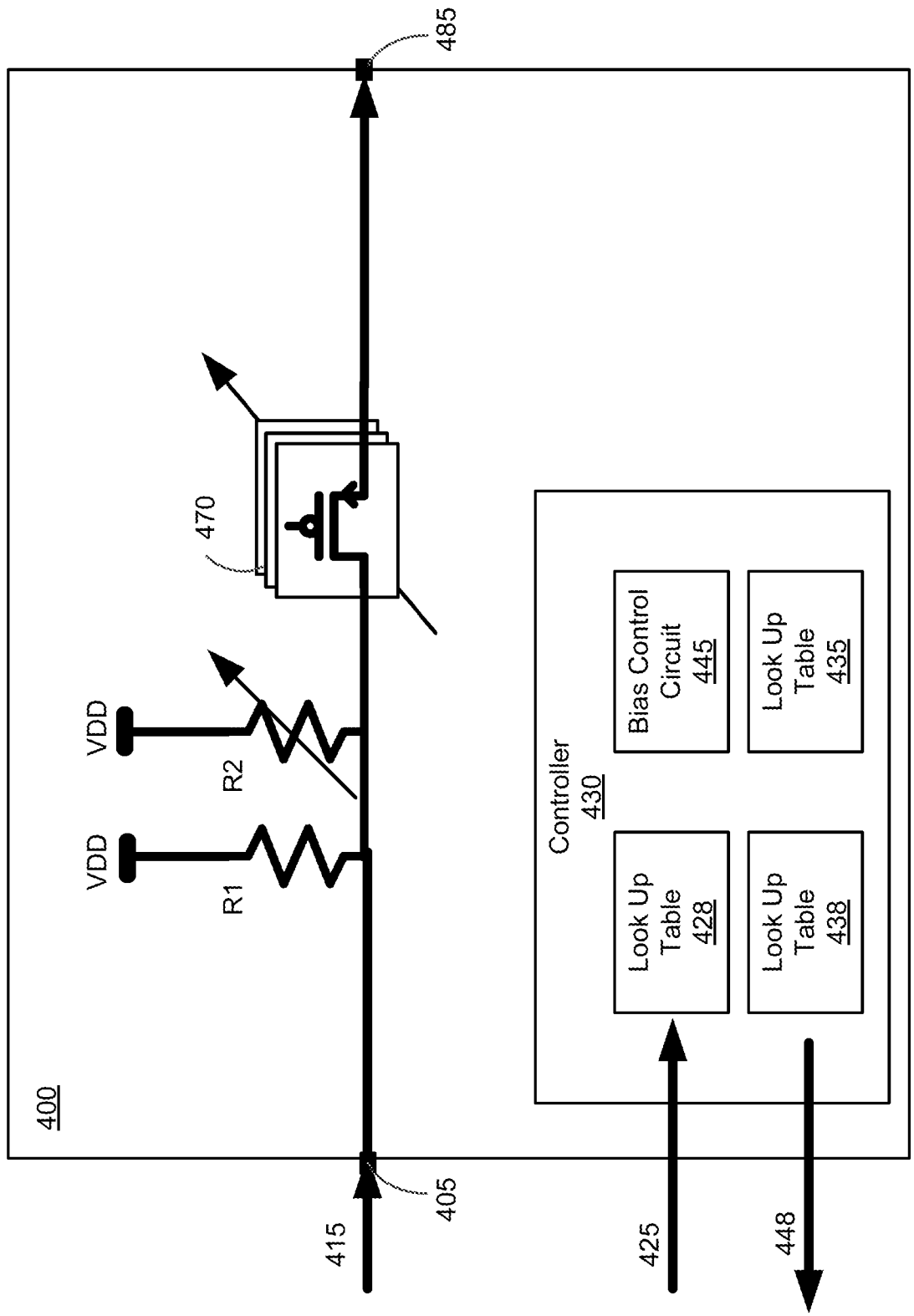
FIG. 4 is a schematic block diagram of a configurable attenuator circuit, in accordance with some embodiments.

FIG. 4 is a schematic block diagram of a configurable attenuator circuit 400, in accordance with some embodiments. In some embodiments, the configurable attenuator circuit 400 includes resistors R1, R2, a set of switches 470, and a controller 430. These components may operate together to adaptively provide attenuation for an input signal 415. The input signal 415 may be at a radio frequency (e.g., 1~10 GHz) for transmission. The input signal 415 may be the signal 335A or the signal 335B. In some embodiments, the configurable attenuator circuit 400 is implemented as part of the DAC circuit 310 in a single integrated circuit. In some embodiments, the configurable attenuator circuit 400 is implemented as part of the interface circuit 370. In some embodiments, the configurable attenuator circuit 400 includes more, fewer, or different components than shown in FIG. 4.

In some embodiments, the resistor R1 is a circuit or a component that provides a resistance. In one configuration, the resistor R1 includes a first electrode coupled to a port 405 and a second electrode coupled to a metal rail providing a supply voltage VDD. In some embodiments, the port 405 may be an output port of the DAC circuit 310. In this configuration, the resistor R1 may provide a fixed resistance (or shunt resistance) at the port 405.

In some embodiments, the resistor R2 is a circuit or a component that provides a configurable resistance. In one configuration, the resistor R2 includes a first electrode coupled to the port 405 and a second electrode coupled to the metal rail providing the supply voltage VDD. In some embodiments, the resistor R2 may be a programmable resistor or a variable resistor. A resistance of the resistor R2 can be set or adjusted, according to a control signal from the controller 430. In this configuration, the resistor R2 may provide a resistance (or shunt resistance) at the port 405, according to the control signal from the controller 430. In one aspect, the resistors R1, R2 are coupled to each other in parallel, and a parallel resistance of the resistors R1, R2 may be provided to the port 405. Hence, a resistance at the port 405 can be adaptively configured by setting or adjusting a resistance of the resistor R2.

In some embodiments, the set of switches 470 is a group of switches coupled in parallel with each other. In one configuration, each switch of the set of switches 470 is coupled between the port 405 and the port 485. Each switch can be embodied as a transistor. In one example, if a voltage difference between a gate electrode and a source electrode of a transistor is larger than a threshold voltage of the transistor, the transistor can be enabled to electrically couple between the source electrode and the drain electrode of the transistor. For example, if a voltage difference between a gate electrode and a source electrode of a transistor is less than a threshold voltage of the transistor, the transistor can be disabled to electrically decouple between the source electrode and the drain electrode of the transistor. In one aspect, switches or transistors in a selected subset can be enabled, in response to receiving an enable voltage from the controller 430. Switches or transistors in a remaining subset or an unselected subset may be disabled, in response to receiving an off voltage (e.g., VDD) from the controller 430.

In one aspect, enabling a subset of the set of switches 470 and disabling a remaining subset of the set of switches 470 can provide a particular attenuation to the input signal 415. In one example, if a switch is enabled, the enabled switch can provide a low resistance (e.g., 5~100 ohm) between the source electrode and the drain electrode. If a switch is disabled, the disabled switch can provide a high resistance (e.g., over 100 Mega ohm) between the source electrode and the drain electrode. Hence, if a subset of the set of switches 470 is enabled and a remaining subset of the set of switches 470 is disabled, a resistance corresponding to a parallel resistance of the enabled subset of the set of switches 470 can be provided between the port 405 and the port 485. The parallel resistance of the enabled subset of the set of switches 470 may correspond to an amount of attenuation applied to the input signal 415. Hence, by enabling a subset of the set of switches 470 according to an amplitude of the input signal 415, a corresponding amount of attenuation can be selectively applied to the input signal 415. The attenuated signal can be provided at the port 485, for example, coupled to the PA 380.

In some embodiments, the controller 430 is a circuit or a component that can configure or control the set of switches 470, the resistor R2, or both. In some embodiments, the controller 430 includes a look up table 428, a look up table 435, a look up table 438, and a bias control circuit 445.

In some embodiments, the look up table 435 and the bias control circuit 445 may operate together to enable a subset of the set of switches 470. In some embodiments, the look up table 435 may be a circuit that stores mapping between a configuration signal 425 indicating an amplitude of the input signal 415 and a corresponding subset of the set of switches 470 to enable. The configuration signal 425 may be provided by the DAC circuit 310 or the processor 230. For example, the configuration signal 425 may be or may correspond to the K-bit data In_A . . . In_K in a digital representation. For example, the configuration signal 425 may indicate or correspond to a carrier frequency (or RF frequency) of the N-bit data D_A . . . D_N. For example, the configuration signal 425 may indicate or correspond to a calibration to adjust a resistance of the set of switches 470 for the input signal 415. In one aspect, the controller 430 can apply the configuration signal 425 to the look up table 435 to determine a subset of the set of switches 470 to enable. The bias control circuit 445 may be a circuit to generate an enable voltage to enable the selected subset of the set of switches 470. An enable voltage may be a voltage causing the selected subset of the set of switches 470 to be enabled or conduct current with a corresponding resistance. The controller 430 may apply the enable voltage generated by the bias control circuit 445 to the selected subset of the set of switches 470, such that the selected subset of the set of switches 470 can be enabled. The controller 430 may apply an off voltage (e.g., VDD) to unselected subset of the set of switches 470 such that the unselected subset of the set of switches 470 can be disabled. An off voltage may be a voltage causing the selected subset of the set of switches 470 to be disabled or not conduct current.

In some embodiments, the look up table 428 may be a circuit that stores mapping between a configuration signal 425 indicating an amplitude of the input signal 415 and a corresponding control signal to set or configure the resistor R2. In such embodiments, the controller 430 may apply the configuration signal 425 to the look up table 428 to determine or generate one or more control signals to configure or set the resistor R2 to have a resistance corresponding to the amplitude of the input signal 415. The look up table 428 may provide the one or more control signals to the resistor R2.

In some embodiments, the look up table 435 and the look up table 428 may be implemented to compensate for or correct for an amplitude error or an amplitude non-linearity due to the attenuation applied by the resistor R2 and/or the set of switches 470. In one aspect, the attenuation applied by the set of switches 470 and the resistor R2 may be non-linear for a change in an amplitude of the input signal 415. In one aspect, the look up table 435 and the look up table 428 may control or set resistances in a non-linear manner for a change in an amplitude of the input signal 415 by the look up table 435, such that the attenuation applied can be linear for the change in the amplitude of the input signal 415 in a log scale.

In some embodiments, the look up table 438 may be a circuit that stores mapping between i) an amount of attenuation to apply or configurations of the resistor R2 and the set of switches 470, and ii) a corresponding phase offset signal 448 indicating a phase offset to apply. In such embodiments, the controller 430 may apply output from the look up table 428 and/or the look up table 435 to the look up table 438 to determine a corresponding phase offset, and generate the phase offset signal 448 indicating the determined phase offset. In some embodiments, the look up table 438 may store mapping between a configuration signal 425 indicating an amplitude of the input signal 415 and a corresponding phase offset signal 448 indicating a phase offset to apply. In such embodiments, the controller 430 may apply the configuration signal 425 to the look up table 438 to determine a corresponding phase offset to apply, and generate the phase offset signal 448 indicating the determined phase offset. In one aspect, a phase of the signal output at the port 485 may be non-linear for the change in the amplitude of the input signal 415, due to the attenuation or resistance of the resistor R2 and the set of switches 470. In one aspect, the look up table 438 can store a phase offset to compensate for or correct for the phase error or phase non-linearity due to the attenuation provided by the configurable attenuator circuit 400. The look up table 438 may provide the phase offset signal 448 indicating the phase offset to the modulator 320. According to the phase offset indicated by the phase offset signal 448, the modulator 320 may adjust a phase of a carrier frequency, such that phase of the N-bit data D_A . . . D_N can be adjusted or corrected.

Advantageously, the configurable attenuator circuit 400 can improve a linearity and/or a dynamic range of the transmitter 224. For example, for the input signal 415 having a first amplitude above a threshold value, a first subset of the set of switches 470 can be enabled to provide a first amount of attenuation to avoid saturation or clipping. For the input signal 415 having a second amplitude below the threshold value and above another threshold value, a second subset of the set of switches 470 having a larger number of switches (or transistors) than the first subset can be enabled to provide a second amount of attenuation lower than the first amount of attenuation. For the input signal 415 having a third amplitude below the another threshold value, the first subset and the second subset of the set of switches 470 can be enabled to provide a third amount of attenuation lower than the second amount of attenuation. By applying varying amounts of attenuation for different amplitudes of the input signal 415, excessive attenuation for the input signal 415 having a low amplitude can be avoided, while a sufficient attenuation for the input signal 415 having a high amplitude can be provided to avoid saturation or clipping.

Figure 5:
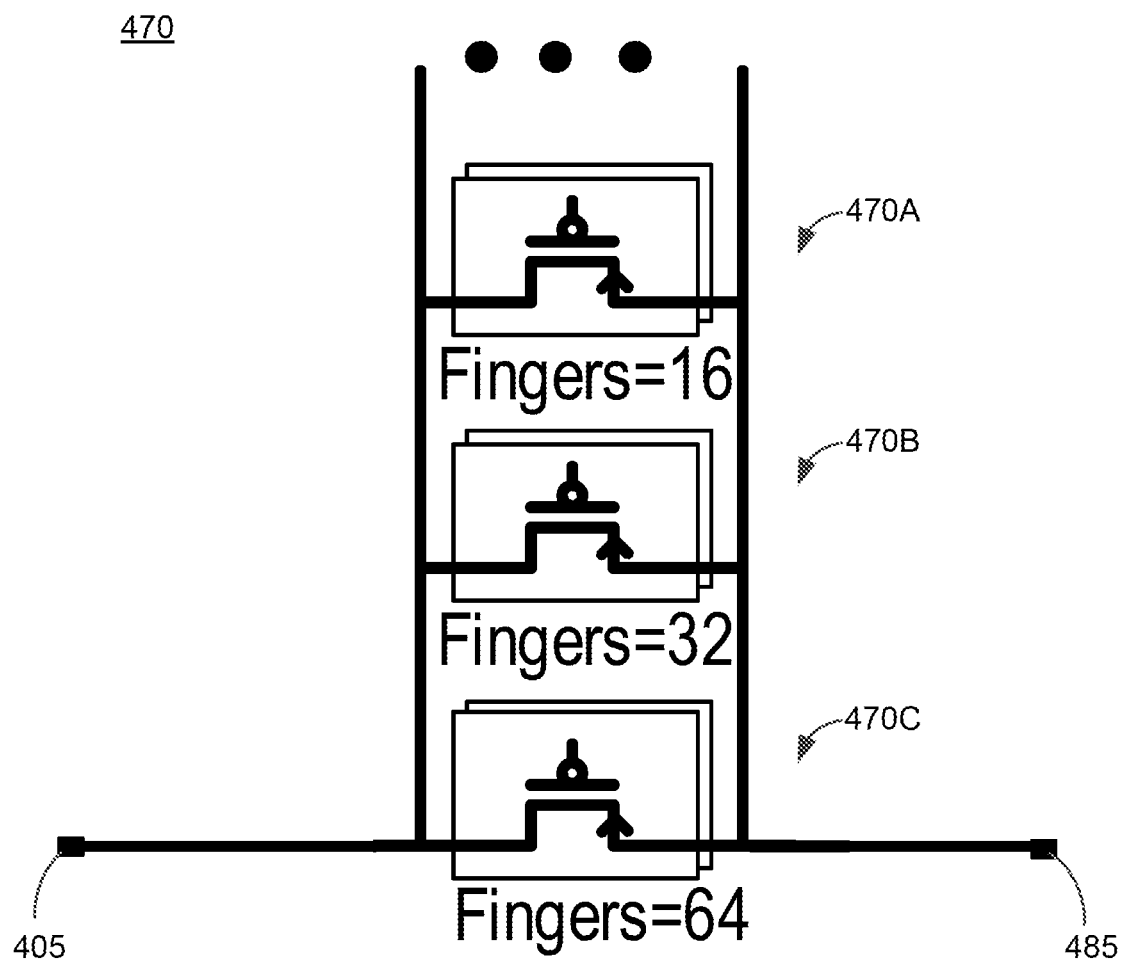
FIG. 5 is a schematic block diagram of a set of switches, in accordance with some embodiments.

FIG. 5 is a schematic block diagram of a set of switches 470, in accordance with some embodiments. In some embodiments, the set of switches 470 includes a first subset 470A, a second subset 470B, and a third subset 470C. Each subset or a combination of different subsets can be enabled to provide a resistance between the port 405 and the port 485. In some embodiments, the set of switches 470 includes more, fewer, or different components than shown in FIG. 5. In some embodiments, the set of switches 470 includes additional subsets than shown in FIG. 5.

In some embodiments, each switch of the set of switches 470 is embodied as a switch. A transistor can be any suitable transistor including, but not limited to, MOSFET, BJT, high voltage transistor, high frequency transistor, FinFET, GaaFET, planar MOS transistor with raised source/drains, nanosheet FET, nanowire FET, or the like. In some embodiments, each transistor may be a P-type transistor. In some embodiments, each transistor may be an N-type transistor. In one configuration, each transistor includes a source electrode coupled to the port 405, and a drain electrode coupled to the port 485. In one configuration, gate electrodes of transistors in the same subset are coupled together, such that the transistors in the same subset can be enabled or disabled together.

In some embodiments, a subset of the set of switches 470 is embodied as transistors having one or more fingers. Transistors having a finger may be referred to as two transistors sharing a source/drain structure, and having two or more gate electrodes coupled or connected together to have a finger shape pattern. In one aspect, the subset 470A may have 16 fingers or 16 transistors connected in parallel to operate as a single transistor. In one aspect, the subset 470B may have 32 fingers or 32 transistors connected in parallel to operate as a single transistor. In one aspect, the subset 470C may have 64 fingers or 64 transistors connected in parallel to operate as a single transistor. The number of fingers or number of transistors in different subsets may correspond to a thermometer code, such that various combination of subsets of transistors or switches can be enabled to provide different resistances or attenuation. For example, the subset 470A of the set of switches 470 enabled may provide a higher resistance than the subset 470B of the set of switches 470 enabled. For example, the subset 470B of the set of switches 470 enabled may provide a higher resistance than the subset 470C of the set of switches 470 enabled. In one aspect, the set of switches 470 is controlled in a non-linear manner for a change in an amplitude of the input signal 415 by the look up table 435, such that the attenuation can be linear for the change in the amplitude of the input signal 415 in a log scale.

Figure 6:
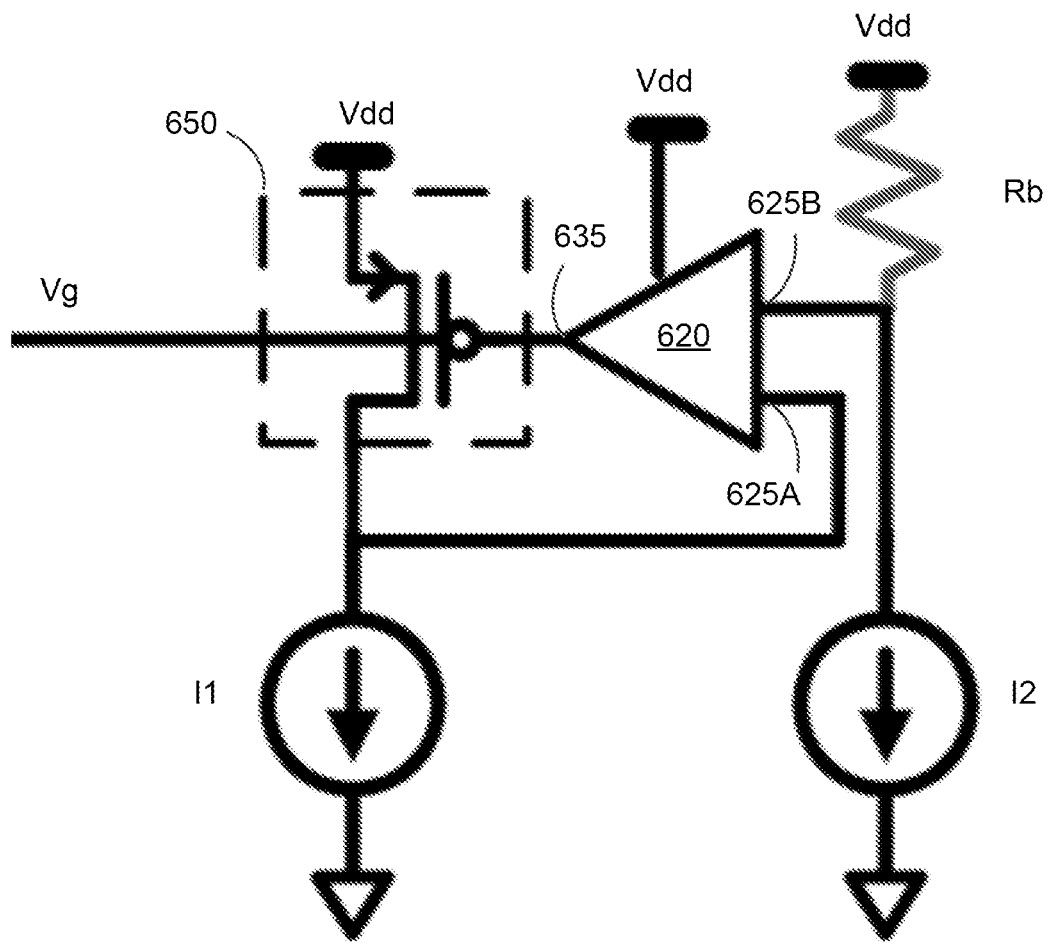
FIG. 6 is a schematic block diagram of a bias control circuit, in accordance with some embodiments.

FIG. 6 is a schematic block diagram of a bias control circuit 445, in accordance with some embodiments. In some embodiments, the bias control circuit 445 includes a transistor 650, an amplifier 620, a resistor Rb, and current sources I1, I2. These components may operate together to generate or provide a bias voltage Vg. In some embodiments, the bias voltage Vg can be applied to a selected subset of the set of switches 470 as an enable voltage. In some embodiments, an enable voltage can be generated or derived based on the bias voltage Vg. In one aspect, the bias control circuit 445 generates the bias voltage Vg to allow the switches 470 to operate consistently, despite a temperature variation. In some embodiments, the bias control circuit 445 includes more, fewer, or different components than shown in FIG. 6.

In some embodiments, the transistor 650 is embodied as the same type of the transistors of the set of switches 470. In one configuration, the transistor 650 includes i) a source electrode coupled to a metal rail providing a supply voltage (e.g., VDD), ii) a gate electrode coupled to an output port 635 of the amplifier 620, and iii) a drain electrode coupled to the current source I1. In this configuration, the transistor 650 can be implemented to mimic a behavior or a characteristic of one or more transistors of the set of switches 470. For example, the transistor 650 can provide a resistance between the metal rail providing the supply voltage VDD and the current source I1, according to the bias voltage Vg from the output port 635 of the amplifier 620.

In some embodiments, the current source I1 is a circuit or a component that can provide a current. In some embodiments, the current source I1 can be embodied as one or more transistors. In one configuration, the current source I1 is coupled between a first input port 625A of the amplifier 620 and a metal rail providing a ground voltage (e.g., GND).

In some embodiments, the current source I2 is a circuit or a component that can provide a current. In some embodiments, the current source I2 can be embodied as one or more transistors. In one configuration, the current source I2 is coupled between a second input port 625B of the amplifier 620 and the metal rail providing the ground voltage (e.g., GND). In one aspect, the current sources I1, I2 provide the same amount of current.

In some embodiments, the resistor Rb is a circuit or a component that can provide a resistance. In some embodiments, the resistor Rb can be embodied as any component that can provide a particular resistance. In some embodiments, the resistor Rb is embodied as a temperature compensation circuit that can provide a consistent resistance for a wide range of temperature (e.g., −20~80 C.°). In one configuration, the resistor Rb is coupled between the second input port 625B of the amplifier 620 and the metal rail providing the supply voltage (e.g., VDD). In this configuration, the resistor Rb can provide a reference resistance to the amplifier 620.

In some embodiments, the amplifier 620 is a circuit or a component that can control a resistance of the transistor 650. In some embodiments, the amplifier 620 is embodied as an operational amplifier or any circuit that can amplify a difference in voltages at the first input port 625A and the second input port 625B and generate the bias voltage Vg at the output port 635, according to the difference in the voltages at the first input port 625A and the second input port 625B. In one configuration, the amplifier 620 includes i) the first input port 625A coupled to the current source I1 and a drain electrode of the transistor 650, ii) the second input port 625B coupled to the current source I2 and the resistor Rb, and iii) the output port 635 coupled to the gate electrode of the transistor 650. In this configuration, the amplifier 620 and the transistor 650 can form a negative feedback loop, such that the amplifier 620 can generate the bias voltage Vb causing the transistor 650 to have a resistance corresponding to the resistance of the resistor Rb. In one aspect, characteristics such as a resistance of a transistor can vary, according to a temperature. By generating the bias voltage Vg that causes the transistor 650 to have a resistance corresponding to the resistance of the resistor Rb (or a temperature compensation circuit) that may be consistent for a wide temperature range (e.g., −20~80 C.°), the bias voltage Vg applied as an enable voltage or an enable voltage obtained or derived from the bias voltage Vg can allow each transistor of the set of switches 470 to have a consistent resistance for a wide temperature range.

Figure 7:
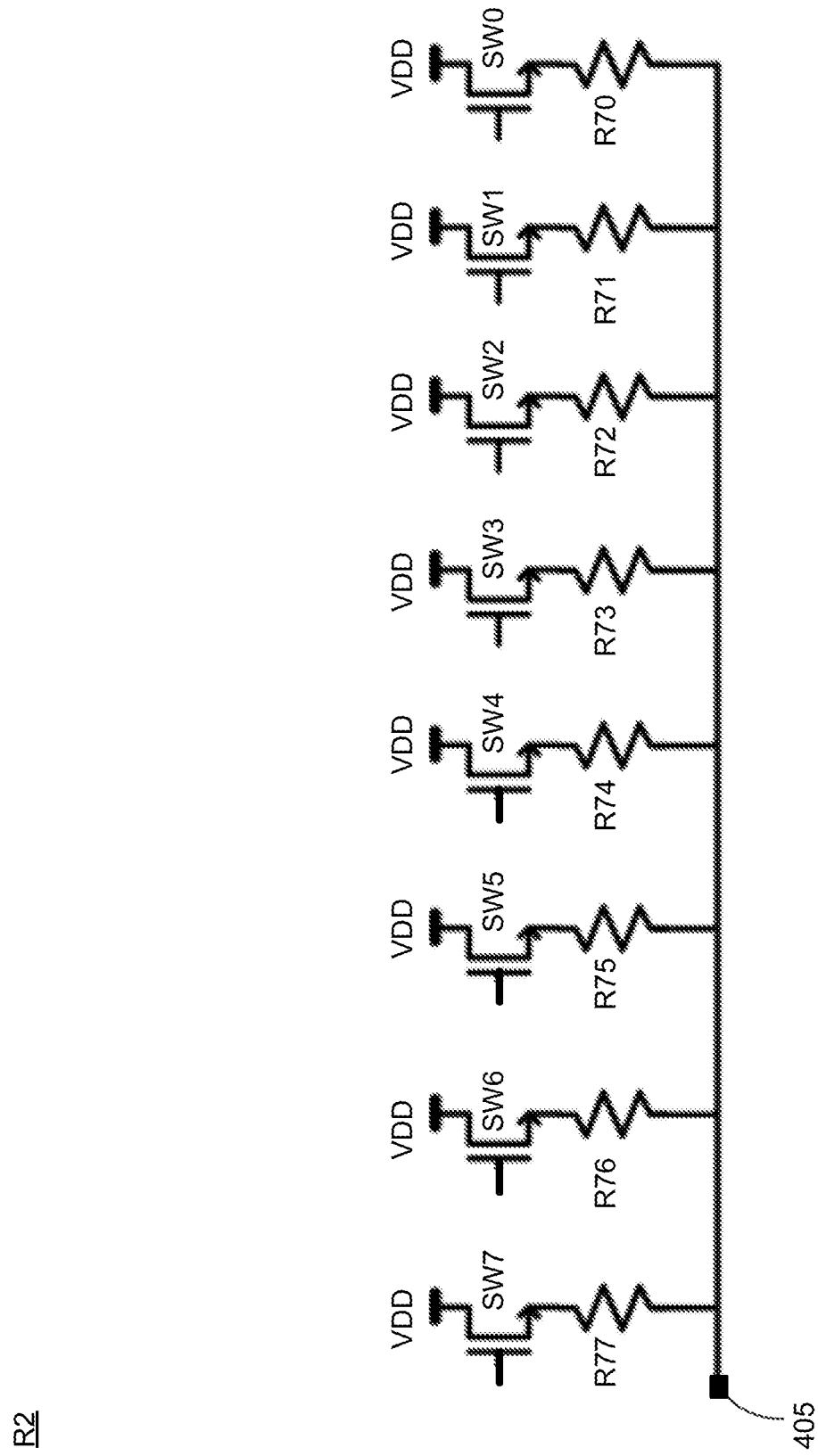
FIG. 7 is a schematic block diagram of a variable resistor, in accordance with some embodiments.

FIG. 7 is a schematic block diagram of a variable resistor R2, in accordance with some embodiments. In some embodiments, the variable resistor R2 includes resistors R70, R71 . . . R77, and a set of switches SW0, SW1 . . . SW7. Each of the switches SW0, SW1 . . . SW7 can be embodied as a transistor. These components may operate together to provide a certain resistance, according to one or more control signals from the controller 430 (or the look up table 428). In some embodiments, the variable resistor R2 includes more, fewer, or different components than shown in FIG. 7. For example, the variable resistor R2 may include a different number of resistors and a different number of switches than shown in FIG. 7. In some embodiments, the variable resistor R2 is embodied as a different circuit (e.g., varactor) or a component that can provide a particular resistance, according to a control signal from the controller 430 (or the look up table 428) corresponding to an amplitude of the signal 415 or an amount of attenuation to apply to the signal 415.

In one configuration, the resistor R70 and the switch SW0 are coupled in series between a metal rail providing a supply voltage (e.g., VDD) and the port 405. Each of the resistors R71-R77 and a corresponding one of the switches SW1-SW7 may be coupled to each other in a similar manner as the resistor R70 and the switch SW0. In some embodiments, the resistors R70-R77 may have different resistances. For example, the resistors R70-R77 may have resistances corresponding to a binary code, a thermometer code, or a combination of the binary code and the thermometer code. In this configuration, one or more of the switches SW0-SW7 can be enabled, according to one or more control signals from the controller 430 (or the look up table 428) to provide a parallel resistance of one or more resistors coupled to the enabled switches SW. The parallel resistance can be provided to the port 405 to attenuate or provide a certain resistance at the port 405. In one aspect, the set switches SW0-SW7 is controlled for a change in an amplitude of the input signal 415 by the look up table 428, such that the attenuation can be linear for the change in the amplitude of the input signal 415 in a log scale.

Figure 8:
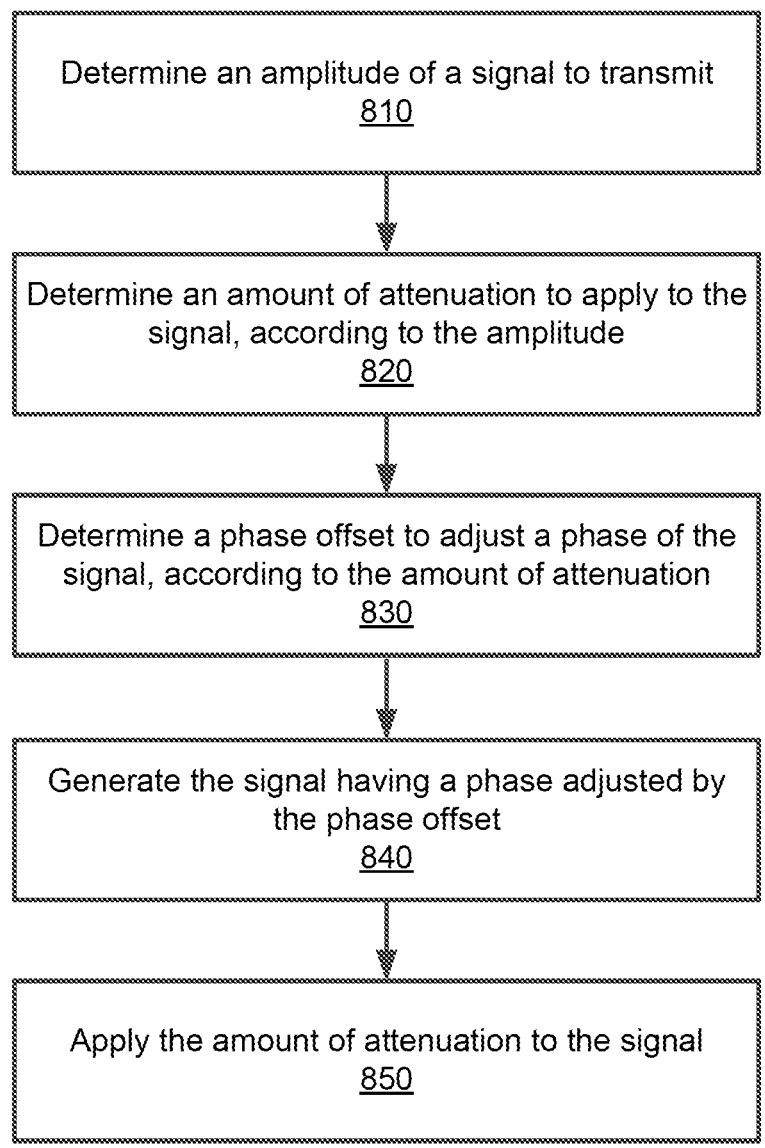
FIG. 8 is a flow diagram showing operations for adaptively attenuating a signal for transmission, in accordance with some embodiments.

FIG. 8 is a flow diagram showing operations 800 for adaptively attenuating a signal for transmission, in accordance with some embodiments. In some embodiments, the operations 800 are performed by a configurable attenuator circuit 400. In some embodiments, the operations 800 are performed by other entities. In some embodiments, the operations 800 include more, fewer, or different steps than shown in FIG. 8.

In one approach, the configurable attenuator circuit 400 determines 810 an amplitude of a signal to transmit (e.g., signal 335A or signal 415). In one approach, the configurable attenuator circuit 400 receives a configuration signal (e.g., configuration signal 425) indicating an amplitude of a signal to transmit (e.g., signal 335A or signal 415). The signal to transmit may be at a radio frequency (e.g., 1~10 GHz). A configuration signal may be a signal indicating an amount of attenuation to provide. The configuration signal may be or may correspond to the K-bit data In_A . . . In_K in a digital representation. Alternatively or additionally, the configuration signal may indicate or correspond to a carrier frequency (or RF frequency) of the N-bit data D_A . . . D_N. Alternatively or additionally, the configuration signal may indicate or correspond to a calibration to adjust or set a resistance of the set of switches 470.

In one approach, the configurable attenuator circuit 400 determines or predicts 820 an amount of attenuation to apply to the signal to transmit (e.g., signal 335A or signal 415), according to the amplitude. In one approach, the configurable attenuator circuit 400 determines a subset of a set of switches (e.g., switches 470) according to the amplitude of the signal to transmit indicated by the configuration signal. In one aspect, each switch of the set of switches can include or can be embodied as a set of transistors connected in parallel. In one approach, the configurable attenuator circuit 400 implements a look up table (e.g., look up table 435) indicating mapping between a configuration signal (e.g., configuration signal 425) indicating an amplitude of the signal to transmit (e.g., signal 335A or signal 415) and a corresponding subset of the set of switches (e.g., switches 470) to enable. The configurable attenuator circuit 400 may apply the configuration signal or an amplitude of the signal to transmit indicated by the configuration signal to the look up table to obtain or determine a subset of the set of switches to enable. In one approach, the configurable attenuator circuit 400 determines a resistance of a variable resistor (e.g., variable resistor R2), according to the amplitude of the signal to transmit indicated by the configuration signal. In one approach, the configurable attenuator circuit 400 implements a look up table (e.g., look up table 428) indicating mapping between a configuration signal (e.g., configuration signal 425) indicating an amplitude of the input signal (e.g., signal 335A or signal 415) and a corresponding control signal to apply to the variable resistor (e.g., variable resistor R2). The configurable attenuator circuit 400 may apply the configuration signal or an amplitude of the signal to transmit indicated by the configuration signal to the look up table to determine or obtain a resistance of the variable resistor.

In one aspect, the configurable attenuator circuit 400 can adjust an amount of attenuation applied to compensate for an amplitude non-linearity due to the attenuation. In one aspect, attenuation applied to a signal may introduce errors to the signal or cause the signal to be non-linear. The look up table (e.g., look up table 428 and/or look up table 435) can generate or provide one or more control signals to set or configure the set of switches and/or the variable resistor to be non-linear for a change in an amplitude of the signal to transmit, such that the attenuation provided by the configurable attenuator circuit 400 can be linear in a log scale.

In one approach, the configurable attenuator circuit 400 determines or predicts 830 a phase offset to adjust a phase of the signal (e.g., signal 415) to transmit, according to the amount of attenuation. In one aspect, a phase of the signal to transmit may be non-linear for the change in the amplitude of the input signal 415, due to the attenuation. In one aspect, the configurable attenuator circuit 400 can implement a look up table (e.g., look up table 438) that stores a mapping between the amount of attenuation provided by the configurable attenuator circuit 400 and a corresponding phase offset to compensate for or correct for the phase error or phase non-linearity due to the attenuation provided by the configurable attenuator circuit 400. The configurable attenuator circuit 400 may apply the configuration signal or an amplitude of the signal to transmit indicated by the configuration signal to the look up table (e.g., look up table 438) to determine or predict the phase offset.

In one approach, the configurable attenuator circuit 400 generates 840 the signal to transmit having a phase adjusted by the determined phase offset. In one approach, the configurable attenuator circuit 400 may provide a phase offset signal (e.g., phase offset signal 448) indicating the phase offset to a modulator (e.g., modulator 320). According to the phase offset indicated by the phase offset signal, the modulator may adjust a phase of a carrier frequency for generating the signal to transmit, such that a phase error or a phase non-linearity of the signal to transmit due to attenuation can be reduced or removed.

In one approach, the configurable attenuator circuit 400 applies 850 the amount of attenuation to the signal to transmit. In one approach, the configurable attenuator circuit 400 enables the determined subset of the set of transistors to attenuate the signal. In one approach, the configurable attenuator circuit 400 may apply an enable voltage to gate electrodes of the selected subset of the set of transistors. The enable voltage may be the bias voltage Vb generated by the bias control circuit 445, or obtained or derived based on the bias voltage Vb. In one approach, the configurable attenuator circuit 400 may apply an off voltage (e.g., VDD) to gate electrodes of a remaining subset (or an unselected subset) of the set of transistors. In response to the enable voltage, the selected subset of the set of transistors can be enabled to provide a corresponding resistance. In response to the off voltage, the remaining subset of the set of transistors can be disabled. By enabling a subset of the set of transistors for an amplitude of the signal to transmit, a corresponding amount of attenuation can be applied to the signal to transmit. For example, if a subset of the set of switches is enabled and a remaining subset of the set of switches is disabled, a resistance corresponding to a parallel resistance of the enabled subset of the set of switches 470 can be applied to the signal to transmit. The parallel resistance of the enabled subset of the set of switches may correspond to an amount of attenuation applied to the signal to transmit. Hence, by enabling a subset of the set of switches according to an amplitude of the signal, a corresponding amount of attenuation can be selectively applied to the signal. In one approach, the configurable attenuator circuit 400 applies a control signal to cause a variable resistor (e.g., resistor R2) to have a corresponding resistance.

Advantageously, the configurable attenuator circuit 400 can improve a linearity and/or a dynamic range of the transmitter 224. For example, for the signal 415 having a first amplitude above a threshold value, a first subset of the set of switches 470 can be enabled to provide a first resistance or a first amount of attenuation to avoid saturation or clipping. For the signal 415 having a second amplitude below the threshold value and above another threshold value, a second subset of the set of switches 470 having a larger number of switches (or transistors) than the first subset can be enabled to provide a second resistance or a second amount of attenuation lower than the first amount of attenuation. For the signal 415 having a third amplitude below the another threshold value, the first subset and the second subset of the set of switches 470 can be enabled to provide a third resistance or a third amount of attenuation lower than the second amount of attenuation. By applying varying amounts of attenuation for different amplitudes of the signal 415, excessive attenuation for the signal 415 having a low amplitude can be avoided, while a sufficient attenuation for the signal 415 having a high amplitude can be provided to avoid saturation or clipping.

The term "coupled" and variations thereof includes the joining of two members directly or indirectly to one another. The term "electrically coupled" and variations thereof includes the joining of two members directly or indirectly to one another through conductive materials (e.g., metal or copper traces). Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first circuit configured to provide a signal;
   a port;
   a first set of transistors including a first number of transistors coupled in parallel between the first circuit and the port; and
   a second set of transistors including a second number of transistors coupled in parallel between the first circuit and the port, the second number larger than the first number; and
   a second circuit configured to:
      determine an amplitude of the signal,
      determine, from the first set of transistors, the second set of transistors, or a combined set of the first set of transistors and the second set of transistors, a third set of transistors to enable, according to the determined amplitude of the signal, and enable the third set of transistors.

2. The device of claim 1, wherein the first circuit is a digital-to-analog converter.

3. A device comprising:
   a first circuit configured to provide a signal;
   a port;
   a first set of transistors including a first number of transistors coupled in parallel between the first circuit and the port; and
   a second set of transistors including a second number of transistors coupled in parallel between the first circuit and the port, the second number being larger than the first number; and
   a resistor including a first electrode coupled to the first circuit and a second electrode coupled to a metal rail, wherein a resistance of the resistor is adjustable.

4. The device of claim 3,
   wherein the first set of transistors coupled in parallel has a first resistance, in response to the first set of transistors being enabled,
   wherein the second set of transistors coupled in parallel has a second resistance, in response to the second set of transistors being enabled, and
   wherein the second resistance is lower than the first resistance.

5. The device of claim 3, further comprising:
   a second circuit configured to:
      determine an amplitude of the signal,
      determine, from the first set of transistors, the second set of transistors, or a combined set of the first set of transistors and the second set of transistors, a third set of transistors to enable, according to the determined amplitude of the signal, and
      enable the third set of transistors.

6. The device of claim 5, wherein the second circuit is configured to determine the first set of transistors as the third set of transistors, in response to the determined amplitude of the signal being larger than a first threshold.

7. The device of claim 6, wherein the second circuit is configured to determine the second set of transistors as the third set of transistors, in response to the determined amplitude of the signal being between the first threshold and a second threshold lower than the first threshold.

8. The device of claim 7, wherein the second circuit is configured to determine the combined set of the first set of transistors and the second set of transistors as the third set of transistors, in response to the determined amplitude of the signal being below the second threshold.

9. The device of claim 5, further comprising:
   a third circuit configured to generate a voltage to apply to gate electrodes of the third set of transistors.

10. The device of claim 3, further comprising:
    a third set of transistors comprising a third number of transistors coupled in parallel between the first circuit and the port, wherein the third number is larger than the second number.

11. The device of claim 3, wherein the device circuit comprises a digital-to-analog converter.

12. A device comprising:
    a first circuit configured to generate a signal;
    a second circuit configured to attenuate the signal; and
    a third circuit configured to:
       cause the second circuit to apply an amount of attenuation to the signal, according to an amplitude of the signal, and
    adjust a phase of the signal, according to the amount of attenuation, wherein the second circuit includes a set of switches coupled in parallel between the first circuit and a port, and
    wherein the third circuit is configured to enable a subset of the set of switches, according to the amplitude of the signal.

13. The device of claim 12, wherein the first circuit is a digital-to-analog converter.

14. A device comprising:
    a first circuit configured to generate a signal;
    a second circuit configured to attenuate the signal; and
    a third circuit configured to:
       cause the second circuit to apply an amount of attenuation to the signal, according to an amplitude of the signal, and
    adjust a phase of the signal, according to the amount of attenuation, wherein the second circuit comprises:
       a first resistor and a first switch coupled in series with each other to the first circuit, and
       a second resistor and a second switch coupled in series with each other to the first circuit,
    wherein the third circuit is configured to enable the first switch, the second switch, or a combination of the first switch and the second switch, according to the amount of attenuation.

15. The device of claim 14,
    wherein the second circuit includes a set of switches coupled in parallel between the first circuit and a port, and
    wherein the third circuit is configured to enable a subset of the set of switches, according to the amplitude of the signal.

16. The device of claim 15,
    wherein a first subset of the set of switches has a first resistance, in response to the first subset of the set of switches being enabled,
    wherein a second subset of the set of switches has a second resistance, in response to the second subset of the set of switches being enabled, and
    wherein the second resistance is lower than the first resistance.

17. The device of claim 16,
    wherein the second subset of the set of switches has a larger number of switches than the first subset of the set of switches.

18. The device of claim 16, wherein the third circuit is configured to enable the first subset of the set of switches, in response to the amplitude of the signal being larger than a first threshold.

19. The device of claim 18, wherein the third circuit is configured to enable the second subset of the set of switches, in response to the amplitude of the signal being between the first threshold and a second threshold lower than the first threshold.

20. The device of claim 19, wherein the third circuit is configured to enable the set of switches, in response to the amplitude of the signal being below the second threshold.

* * * * *